United States Patent [19]

Tanaka

[11] Patent Number: 4,590,435
[45] Date of Patent: May 20, 1986

[54] HIGH INPUT IMPEDANCE DIFFERENTIAL AMPLIFIER

[75] Inventor: Tatsuo Tanaka, Yokohama, Japan

[73] Assignee: Kabushiki Kaisha Toshiba, Japan

[21] Appl. No.: 708,523

[22] Filed: Mar. 5, 1985

[30] Foreign Application Priority Data

Mar. 6, 1984 [JP] Japan ................................ 59-42755

[51] Int. Cl.⁴ ............................................. H03F 3/45
[52] U.S. Cl. ................................. 330/258; 330/257; 330/288
[58] Field of Search ............... 330/252, 257, 258, 288, 330/307

[56] References Cited

U.S. PATENT DOCUMENTS 3,946,325 3/1976 Leidich ............................. 330/258
4,232,271 11/1980 Dobkin et al. .................... 330/258

FOREIGN PATENT DOCUMENTS 50-10954 8/1975 Japan.

Primary Examiner—Eugene R. Laroche
Assistant Examiner—Steven J. Mottola
Attorney, Agent, or Firm—Finnegan, Henderson, Farabow, Garrett & Dunner

[57] ABSTRACT

A differential amplifier includes first and second current sources, first and second pnp transistors having bases connected to first and second input terminals and emitters connected to the first current source, an npn transistor having a base, collector and emitter respectively connected to the collector of the first pnp transistor, the first current source and a ground terminal, and an npn transistor having a base, collector and emitter respectively connected to the collector of the second pnp transistor, the second current source and the ground terminal.

12 Claims, 12 Drawing Figures

4,590,435

HIGH INPUT IMPEDANCE DIFFERENTIAL AMPLIFIER

BACKGROUND OF THE INVENTION

The present invention relates to a differential amplifier which has high input impedance and a very small DC offset voltage.

FIG. 1 shows a conventional differential amplifier. This differential amplifier has pnp transistors TR1 and TR2 having bases connected to inverting and non-inverting input terminals IIT and NIT, a current mirror circuit of npn transistors TR3 and TR4 for transmitting the same current to these transistors TR1 and TR2, an npn output transistor TR5 having the base coupled to the collector of the transistor TR4, a constant current source CS1 for supplying a current to the transistors TR1 and TR2, and a constant current source CS2 for supplying a current to the transistor TR5.

Bipolar monolithic integrated circuits are generally manufactured by a process which is suitable for mass-production. For this reason, pnp transistors are often formed as lateral pnp transistors. However, pnp transistors have a low current amplification factor and this renders circuit design difficult.

The differential amplifier using the pnp transistors TR1 and TR2 in FIG. 1 can be operated at a low voltage. However, if the current amplification factor of the pnp transistors TR1 and TR2 is small, the base currents of these pnp transistors TR1 and TR2 are no longer negligible. Thus, in order to realize a differential amplifier having a high input impedance and a small DC offset voltage, the emitter currents of the pnp transistors TR1 and TR2 must be kept to a minimum. Therefore, the output current of the constant current source CS1 must be kept small. This requires a circuit for obtaining a small constant current and renders the construction of the differential amplifier complex.

The differential amplifier shown in FIG. 2 is the same as that shown in FIG. 1 except that the pnp transistor TR1 is replaced with a transistor circuit of pnp transistors TR1A and TR1B, and the pnp transistor TR2 is replaced with a transistor circuit of transistors TR2A and TR2B. When these transistor circuits are used, their base currents can be kept at negligible values and a differential amplifier of high input impedance can be realized. However, in this case, since the equivalent base-emitter voltage of the transistor circuits becomes twice that of the pnp transistor TR1 or TR2, the differential amplifier shown in FIG. 2 cannot operate at a very low voltage, for example, 0.9 V.

SUMMARY OF THE INVENTION

It is an obejct of the present invention to provide a differential amplifier which can operate at a low voltage, even if the power source voltage is 0.9 V, and which has a simple circuit configuration, a small DC offset voltage and a high input impedance.

This object of the present invention can be achieved by a differential amplifier including first and second current sources; first and second transistors of one conductivity type having bases coupled to first and second input terminals, respectively, and emitters coupled to the first current source; a third transistor of the opposite conductivity type having a base, a collector and an emitter respectively connected to the collector of the first transistor, the first current source, and a reference voltage terminal; and a fourth transistor of the opposite conductivity type, having a base, a collector and an emitter respectively coupled to the collector of the second transistor, the second current source and the reference voltage terminal.

According to the present invention, the collector current of the first and second transistors can be decreased, so that the input impedance of the differential amplifier can be increased. Furthermore, since the first and second input terminals are connected to the bases of the first and second transistors whose emitters are connected to each other, the differential amplifier can operate at a low voltage. Since the base-emitter voltages of the first and second transistors can be set to be equal to each other in a balanced state, the DC offset voltage can be set at substantially 0 V.

DETAILED DESCRIPTION OF THE PREFERRED EMBODIMENTS

Figure 3:
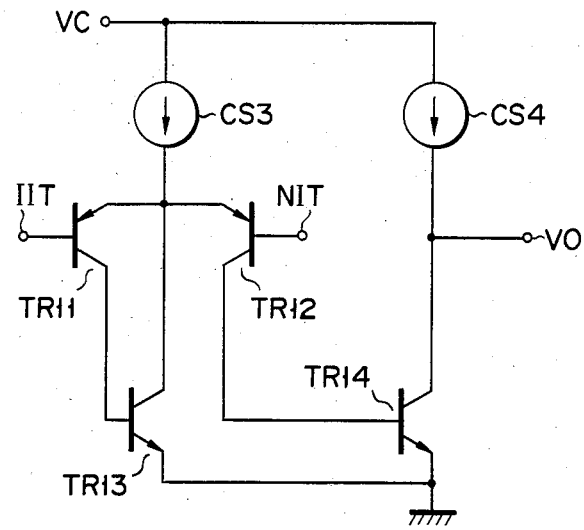
FIG. 3 is a circuit diagram of a differential amplifier according to an embodiment of the present invention.

FIG. 3 shows the basic configuration of a differential amplifier according to an embodiment of the present invention. This differential amplifier has current sources CS3 and CS4 each for supplying an output current IO, pnp transistors TR11 and TR12 having the same operating characteristics, and npn transistors TR13 and TR14 having the same operating characteristics. The bases of the transistors TR11 and TR12 are connected to inverting and non-inverting input terminals IIT and NIT, and the emitters thereof are both coupled to the current source CS3. The transistors TR13 and TR14 have their bases coupled to the collectors of the transistors TR11 and TR12, collectors connected to the current sources CS3 and CS4, respectively, and emitters grounded. The collector of the transistor TR14 is connected to an output terminal V0.

Figure 4:
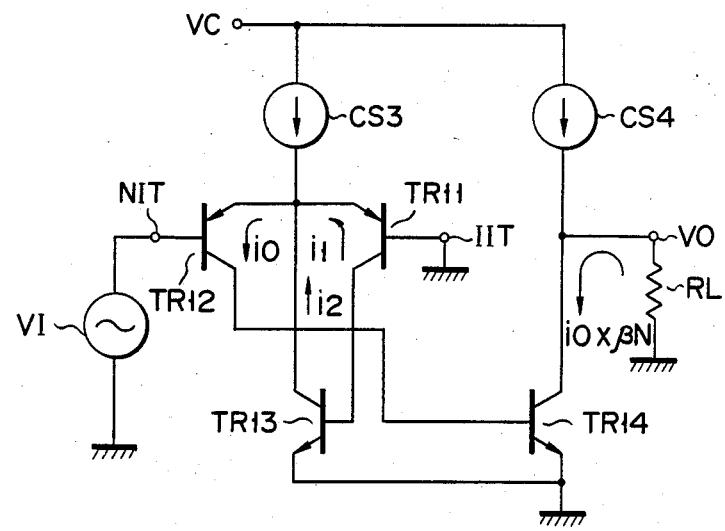
FIG. 4 is a circuit diagram for explaining the mode of operation of the differential amplifier shown in FIG. 3.

In order to explain the mode of operation of the differential amplifier shown in FIG. 3, a case will be considered wherein a signal source VI is connected to the non-inverting input terminal NIT, the inverting input terminal IIT is grounded, and a load resistor RL is connected to the output terminal V0, as shown in FIG. 4.

In the circuit shown in FIG. 4, assume that a signal current i0 flows from the emitter to collector of the transistor TR12, a signal current i1 flows from the base to the emitter of the transistor TR11, and a signal current i2 flows to the transistor TR13. These signal currents i0, i1 and i2 hold the following relationship:

$$i0 = i1 + i2 \quad (1)$$

When the current amplification factor of the transistor TR13 is represented by $\beta N$, the current i1 is given by:

$$i1 = i2/\beta N \quad (2)$$

Since the current amplification factor $\beta N$ is sufficiently larger than unity, $i2 \gg i1$. This means that the current i0 is more influenced by a change in the current i2 than that in the current i1. Therefore, the equation (1) can be approximately rewritten as:

$$i1 = i0/\beta N \quad (3)$$

When the current amplification factor $\beta N$ of the transistors TR13 and TR14 is sufficiently larger than unity, the DC current flowing into the collectors of the transistors TR13 and TR14 changes in accordance with change in the output current I0 of the current sources CS3 and CS4. The DC currents IC1 and IC2 flowing into the transistors TR11 and TR12 are very small and satisfy the following equation:

$$IC = IC1 = IC2 = I0/\beta N \quad (4)$$

If a signal of small amplitude is supplied from the signal source VI, emitter resistances re1 and re2 of the transistors TR11 and TR12 are given by:

$$re = re1 = re2 = 2VT/IC \quad (5)$$

where VT is the thermal voltage.

An input signal voltage vi supplied to the base of the transistor TR12 holds the following relation with the signal current i0:

$$vi = i0 \times re1 + i1 \times re2 \quad (6)$$

Substitution of the equations (3) and (5) into the equation (6) yields:

$$vi = (1 + 1/\beta N) \times i0 \times 2VT/IC \approx i0 \times (2VC/IC) \quad (7)$$

When the current amplification factor of the transistor TR12 is set to be $\beta P$, the signal current i0 and the base current ib of the transistor TR12 hold the following relation:

$$ib = i0/\beta P \quad (8)$$

From the equations (4), (7) and (8), an input impedance Rin is given by:

$$\begin{aligned} Rin &= vi/ib = (i0 \times (2VT/I0))/(i0/\beta P) \\ &= \beta P \times (2VT/IC) \\ &= \beta P \cdot \beta N \cdot (2VT/I0) \end{aligned} \quad (9)$$

Since the signal current i0 is supplied to the base of the transistor TR14, the signal current flowing into the collector of the transistor TR14 becomes $i0 \times \beta N$. The signal current $i0 \times \beta N$ flows to the collector of the transistor TR14 through the load resistor RL. Therefore, an output signal voltage vo given by the following equation is obtained from the output terminal V0:

$$vo = i0 \times \beta N \times RL \quad (10)$$

The output signal voltage vo becomes negative with respect to ground. Since the input signal voltage vi is also negative, the signal voltages vi and vo have the same phase.

In this case, a voltage gain AV (i.e., the open loop gain) of the differential amplifier shown in FIG. 4 is given by:

$$\begin{aligned} AV &= vo/vi = (iO \times \beta N \cdot RL)/(iO \times (2VT/IC)) \\ &= (\beta N \cdot IC \cdot RL)/2VT \\ &= (IO \cdot RL)/2VT \end{aligned} \quad (11)$$

In this manner, the voltage gain AV of the differential amplifier can be expressed as a function of the output current I0 of the current sources CS3 and CS4.

When the DC currents IC1 and IC2 flowing into the transistors TR11 and TR12 are decreased, the input impedance Rin can be increased and the base currents of the transistors TR11 and TR12 can be reduced. The open loop gain is not very large as can be seen from the equation (11). However, since this differential amplifier is designed such that the base-emitter voltages of the transistors TR11 and TR12 become equal to each other in a non-feedback state, the DC offset voltage is suppressed to a sufficiently small value. In this differential amplifier, the DC offset voltage between the input signal voltage vi and the output signal voltage vo is substantially 0 V.

Figure 1:
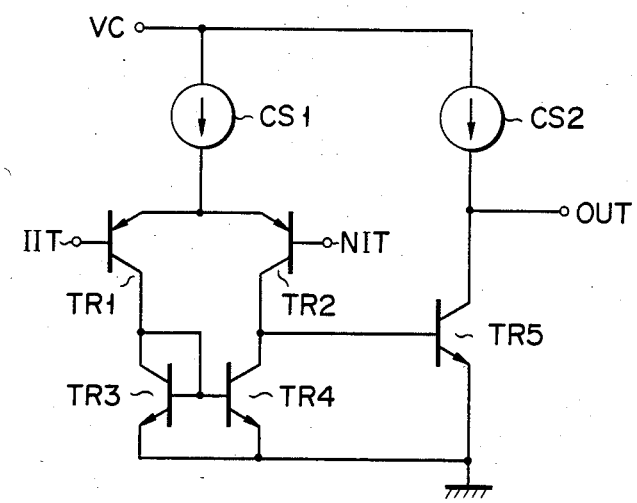
FIG. 1 is a circuit diagram of a conventional differential amplifier.
Figure 2:
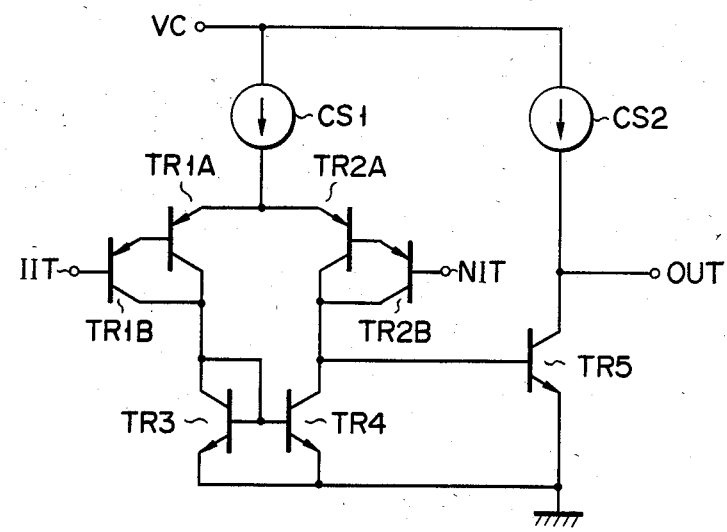
FIG. 2 is a circuit diagram of a conventional differential amplifier which has a high input impedance and which is improved over that shown in FIG. 1.

In the differential amplifier shown in FIGS. 3 and 4, a constant current source need not be used to flow a small constant current and transistor circuits as shown in FIG. 2 need not be used. Nevertheless, a differential amplifier having a very small DC offset voltage and a high input impedance can be obtained.

Figure 5:
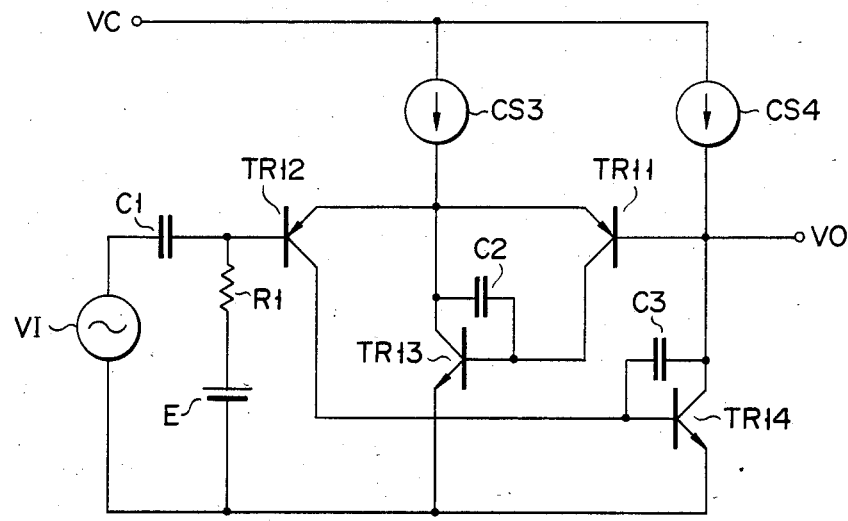
FIG. 5 is a circuit diagram of a voltage follower using the differential amplifier shown in FIG. 3.

FIG. 5 shows a circuit diagram of a voltage follower circuit using the differential amplifier shown in FIG. 3 and having a voltage gain of unity. In this voltage follower circuit, the base of a transistor TR11 is connected to an output terminal V0, and the base of a transistor TR12 is connected to a DC power source E through a resistor R1 and to a signal source VI through a capacitor C1. Capacitors C2 and C3 are respectively coupled between the bases and collectors of transistors TR13 and TR14. Since the emitters of the transistors TR11 and TR12 are commonly connected to a current source CS3, the base voltages of the transistors TR11 and TR12 become equal to each other. Thus, a voltage follower circuit having a high input impedance and a very small DC offset voltage is obtained.

Figure 6A:
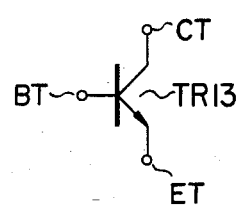
FIGS. 6A to 6D show transistor circuits which can be used in place of the npn transistor in the differential amplifier shown in FIG. 3.
Figure 6B:
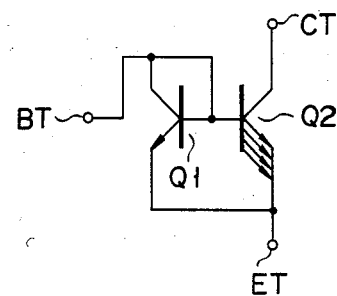

In the differential amplifier shown in FIG. 3, the transistors TR13 and TR14 can be replaced with a transistor circuit. FIG. 6A shows, for example, a transistor TR13. The base, emitter and collector of the transistor TR13 are coupled to base, emitter and collector terminals BT, ET and CT, respectively. FIG. 6B shows a transistor circuit. The transistor circuit includes npn transistors Q1 and Q2. The npn transistor Q1 has the collector and base coupled to the base terminal BT and the emitter coupled to the emitter terminal ET. The npn transistor Q2 has the base, collector and emitter connected to the base, collector, and emitter terminals BT, CT and ET, respectively. The transistor Q2 has an emitter area n times that of the transistor Q1. Therefore, this transistor circuit is equivalent to a single npn transistor having a current amplification factor n×βN.

Figure 6C:
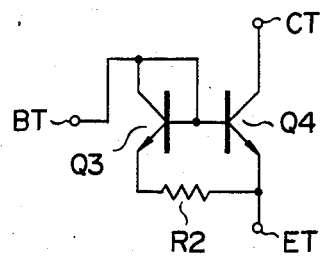

FIG. 6C shows a transistor circuit of npn transistors Q3 and Q4. The transistor Q3 has the base and collector connected to the base terminal BT and the emitter connected to the emitter terminal ET through a resistor R2. The transistor Q4 has the base, collector and emitter connected to the base, collector and emitter terminals BT, CT and ET, respectively. The current amplification factor of this transistor circuit is determined by the ratio of the current flowing to the transistor Q4 to the current flowing through the base terminal.

Figure 6D:
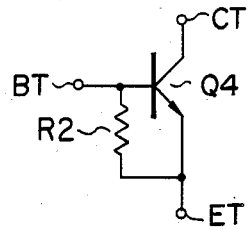

FIG. 6D shows a transistor circuit obtained by eliminating the transistor Q3 from the circuit shown in FIG. 6C and coupling one end of the resistor R2 to the base terminal. The current amplification factor of this transistor circuit is also determined by the ratio of the current flowing to the transistor Q4 to the current flowing through the base terminal BT. When such a transistor circuit is used, the transistors TR13 and TR14 can be replaced with a transistor circuit having a suitable current amplification factor.

Figure 7:
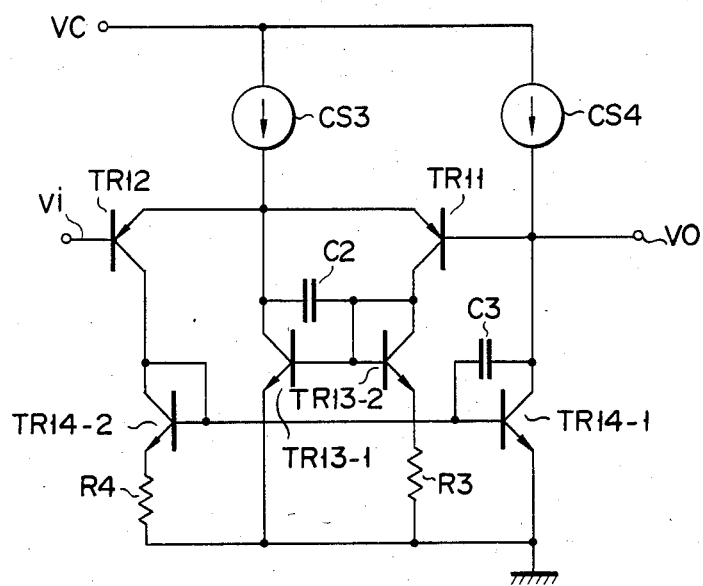
FIG. 7 is a circuit diagram of a voltage follower obtained by combining the differential amplifier shown in FIG. 3 with the transistor circuit shown in FIG. 6C.

FIG. 7 shows a voltage follower circuit using the differential amplifier shown in FIG. 3. In this voltage follower circuit, the base of a transistor TR11 is connected to an output terminal V0. Each of npn transistors TR13 and TR14 is replaced with the transistor circuit shown in FIG. 6C. More specifically, the transistor TR13 is replaced with a transistor circuit formed of npn transistors TR13-1 and TR13-2. The transistor TR13-1 has the collector coupled to a current source CS3 and a grounded emitter. The transistor TR13-2 has the base and collector coupled to the base of the transistor TR13-1 and to the collector of the transistor TR11, and the emitter grounded through a resistor R3. The transistor TR14 is replaced with a transistor circuit formed of npn transistors TR14-1 and TR14-2. The transistor TR14-1 has the base and collector coupled to the collector of the transistor TR12 and to a current source CS4, and also has a grounded emitter. The transistor TR14-2 has the base and collector coupled to the collector of the transistor TR12, and an emitter grounded through a resistor R4. A capacitor C2 is inserted between the base and collector of the transistor TR13-1, and a capacitor C3 is inserted between the base and collector of the transistor TR14-1. With this voltage follower, a high input impedance and a very small offset voltage can be obtained.

Figure 8:
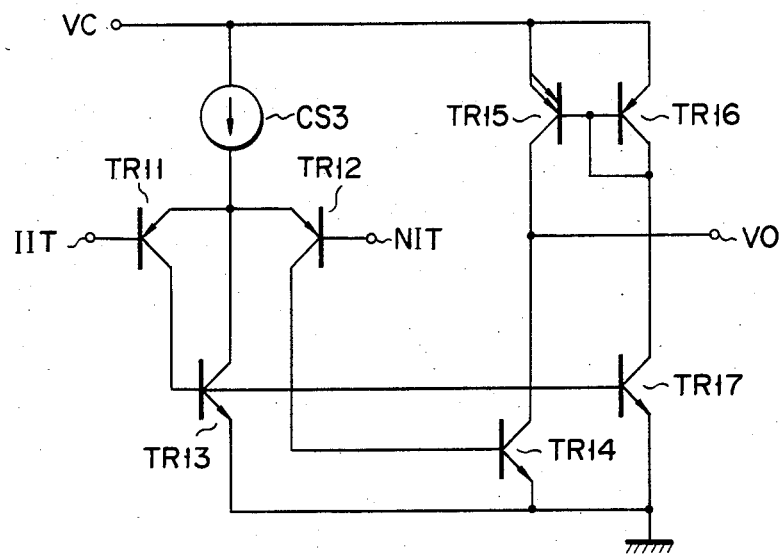
FIG. 8 is a circuit diagram of a differential amplifier obtained by using a current mirror circuit and an npn transistor in place of the current source shown in FIG. 3.

The differential amplifier shown in FIG. 8 is the same as that shown in FIG. 3 except that the current source CS4 is omitted, and a current mirror circuit formed of pnp transistors TR15 and TR16 and an npn transistor TR17 having the base connected to the collector of a transistor TR11 and a grounded emitter. The transistor TR15 is a double-emitter transistor which has the emitters coupled to a power source terminal VC, and the collector coupled to an output terminal V0 and to the collector of the transistor TR14. The transistor TR16 has the emitter coupled to the power source terminal VC, and the base and collector coupled to the base of the transistor TR15 and to the collector of a transistor TR17. The transistor TR15 has an emitter area twice that of the transistor TR16 for the following reason. That is, with this configuration, when the same signal voltage is applied to input terminals IIT and NIT, the collector currents of the transistors TR11 and TR12 are set to be equal to each other so as to have the same base-emitter voltage and to reduce the DC offset voltage to 0 V.

This differential amplifier operates in substantially the same manner as the circuit shown in FIG. 3 and has the same effect.

Figure 9:
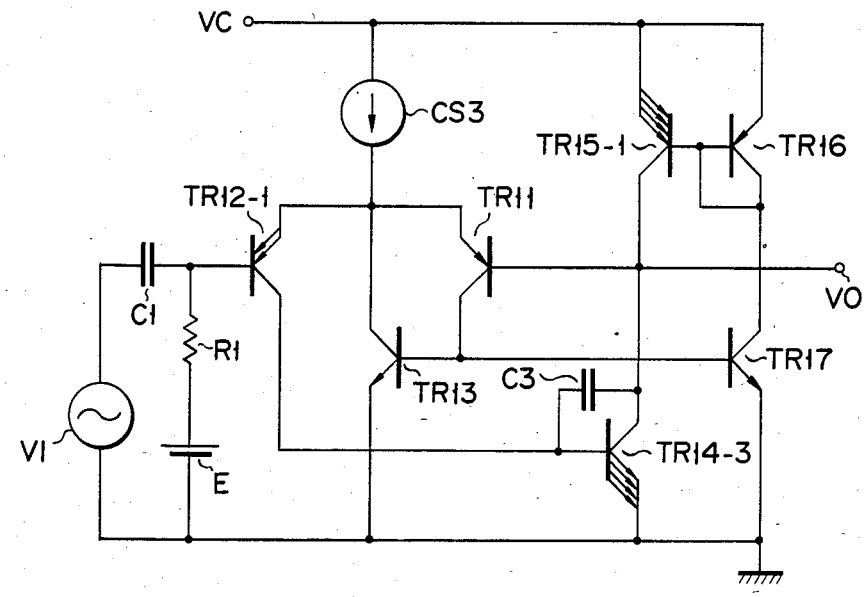
FIG. 9 shows a modification of the voltage follower shown in FIG. 5.

FIG. 9 shows a modification of the voltage follower circuit shown in FIG. 5. In this voltage follower circuit, the current source CS4 and the capacitor C2 are omitted. A current mirror circuit formed of pnp transistors TR15-1 and TR16 is used. An npn transistor TR17 is also used which has the base coupled to the collector of the transistor TR11 and has a grounded emitter. The transistors TR12 and TR14 are replaced with a double-emitter pnp transistor TR12-1 and a multi-emitter npn transistor TR14-3, respectively.

In the voltage follower circuit in FIG. 9, the transistor TR12-1 has an emitter area twice that of the transistor TR11 for the following reason. That is, with this circuit configuration, the densities of currents flowing to the emitters of the transistors TR11 and TR12-1 are set to be equal to each other so as to match the base-emitter voltage VBE1 of the transistor TR11 with the base-emitter voltage VBE2 of the transistor TR12-1 and to keep the DC offset voltage substantially at 0 V.

In general, the base-emitter voltage of a transistor is given by:

$$VBE = VT \cdot \ln(IC/IS)$$

where VT is the thermal voltage and is about 26 mV at 25° C., and IS is the saturation current given by:

$$IS = JS \cdot A$$

where JS is the saturation current density per unit emitter area of this transistor and A is the ratio of the emitter area of this transistor to the unit emitter area. In order to match the base-emitter voltages of two transistors, if the collector current is doubled, IS or A must also be doubled.

Assume that the current amplification factor of the transistors TR11 and TR12-1 exceeds a predetermined value and a reference current I0 flowing to the transistor TR13 can be regarded as the collector current thereof. Since the transistors TR13 and TR17 have the same base-emitter voltages, the DC current I0 also flows to this transistor TR17. Therefore, when the current amplification factor of the transistors TR13 and TR17 is represented by βN, the collector current of the transistor TR11 is given as 2I0/βN. Since the transistor TR15-1 has an emitter area four times that of the transistor TR16, the collector current of the transistor TR15-1 is given as 4I0. Then, the base current of the transistor TR14-3 or the collector current of the transistor TR12-1 is given as 4I0/βN. The collector current of the transistor TR12-1 becomes twice the collector current 2I0/βN of the transistor TR11. Since the emitter area of the transistor TR12-1 is twice that of the transistor TR11, the base-emitter voltages of the transistors TR11 and TR12-1 become equal to each other.

Although the present invention has been described with reference to its particular embodiment, the present invention is not limited thereto. For example, a voltage follower circuit similar to that shown in FIG. 5 can be obtained using the transistor circuit shown in FIG. 6B or 6D in place of each of the transistors TR13 and TR14 shown in FIG. 3.

It is also possible to use a transistor circuit shown in FIG. 6B, 6C or 6D in place of each of the transistors TR13 and TR14 shown in FIG. 8.

What is claimed is:

1. A differential amplifier comprising:
   first and second power source terminals;
   first and second input terminals and an output terminal;
   first and second current sources each having one end coupled to said first power source terminal;
   first and second transistors of one conductivity type having bases respectively connected to said first and second input terminals and emitters coupled to the other end of said first current source;
   a third transistor of an opposite conductivity type having a base, collector and emitter respectively coupled to a collector of said first transistor, the other end of said first current source and second power source terminal; and
   a fourth transistor of the opposite conductivity type having a base and emitter respectively coupled to a collector of said second transistor and said second power source terminal and a collector coupled to the other end of said second current source and to said output terminal.

2. A differential amplifier according to claim 1, wherein said first and second transistors are pnp transistors, and said third and fourth transistors are npn transistors.

3. A differential amplifier according to claim 2, wherein each of said third and fourth transistors have a resistor connected between the base and emitter.

4. A differential amplifier according to claim 2, in which said third and fourth transistors are multi-emitter transistors, and which further comprises fifth and sixth transistors of the opposite conductivity type having bases coupled to the bases of said third and fourth transistors, emitters coupled to the emitters of said third and fourth transistors, and collectors coupled to said bases thereof.

5. A differential amplifier according to claim 2, which further comprises fifth and sixth transistors of the opposite conductivity type having bases coupled to the bases of said third and fourth transistors, a first resistor coupled between emitters of said third and fifth transistors, and a second resistor coupled between emitters of said fourth and sixth transistors.

6. A differential amplifier according to claim 1, wherein said second current source comprises a fifth transistor of the one conductivity type having an emitter and collector coupled to said first power source terminal and the collector of said fourth transistor respectively, a sixth transistor of the one conductivity type having an emitter coupled to said first power source terminal and a base and collector coupled to a base of said fifth transistor, and a seventh transistor of the opposite conductivity type having a base, collector and emitter coupled to said collector of said first transistor, said collector of said sixth transistor, and said second power source terminal.

7. A differential amplifier according to claim 6, wherein said first, second, fifth and sixth transistors are pnp transistors, and said third, fourth and seventh transistors are npn transistors respectively.

8. A differential amplifier according to claim 7, wherein each of said third and fourth transistors have a resistor connected between the base and emitter.

9. A differential amplifier according to claim 7, in which said third and fourth transistors are multi-emitter transistors, and which further comprises eighth and ninth transistors of the opposite conductivity type having bases coupled to the bases of said third and fourth transistors, emitters coupled to said emitters of said third and fourth transistors, and collectors coupled to said bases thereof.

10. A differential amplifier according to claim 7, which further comprises eighth and ninth transistors of the opposite conductivity type having bases coupled to the bases of said third and fourth transistors, a first resistor coupled between emitters of said third and fifth transistors, and a second resistor coupled between emitters of said fourth and sixth transistors.

11. A differential amplifier according to claim 7, wherein said fifth transistor has an emitter area twice that of said sixth transistor.

12. A voltage follower circuit comprising:
    first and second power source terminals;
    an input terminal and an output terminal;
    first and second current sources each having one end coupled to said first power source terminal;
    first and second transistors of one conductivity type having bases connected to said output and input terminals and emitters coupled to the other end of said first current source;
    a third transistor of an opposite conductivity type having a base, collector and emitter respectively coupled to a collector of said first transistor, the other end of said first current source and to said second power source terminal; and
    a fourth transistor of the opposite conductivity type having a base and emitter respectively coupled to a collector of said second transistor and said second power source terminal and a collector coupled to the other end of said second current source and to said output terminal.

* * * * *